(12) United States Patent
Paek et al.

(10) Patent No.: US 8,148,178 B2
(45) Date of Patent: Apr. 3, 2012

(54) METHOD OF GROWING NITRIDE SINGLE CRYSTAL AND METHOD OF MANUFACTURING NITRIDE SEMICONDUCTOR LIGHT EMITTING DEVICE

(75) Inventors: Ho Sun Paek, Gyunggi-do (KR); Sung Nam Lee, Gyunggi-do (KR); Jeong Wook Lee, Gyunggi-do (KR); Il Hyung Jung, Seoul (KR); Youn Joon Sung, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 160 days.

(21) Appl. No.: 12/263,873

(22) Filed: Nov. 3, 2008

(65) Prior Publication Data
US 2009/0298214 A1 Dec. 3, 2009

(30) Foreign Application Priority Data
Jun. 3, 2008 (KR) .................. 10-2008-0052137

(51) Int. Cl.
*H01L 33/00* (2010.01)
(52) U.S. Cl. .......... 438/22; 438/761; 257/E33.001
(58) Field of Classification Search ........ 438/22, 438/34, 36, 761, 763; 257/E33.001, E33.003, 257/E33.005
See application file for complete search history.

(56) References Cited

U.S. PATENT DOCUMENTS

| | | | |
|---|---|---|---|
| 6,015,979 A * | 1/2000 | Sugiura et al. .......... 257/86 |
| 6,252,261 B1 | 6/2001 | Usui et al. | |
| 6,271,104 B1 * | 8/2001 | Razeghi et al. ....... 438/481 |
| 6,602,763 B2 | 8/2003 | Davis et al. | |
| 6,809,351 B2 * | 10/2004 | Kuramoto et al. ......... 257/190 |
| 2001/0013605 A1 * | 8/2001 | Umezaki et al. .......... 257/13 |
| 2005/0040407 A1 * | 2/2005 | Kohda .................... 257/79 |
| 2005/0202682 A1 * | 9/2005 | Kiyoku et al. ........... 438/762 |

(Continued)

FOREIGN PATENT DOCUMENTS
JP 2000-021789 1/2000
(Continued)

OTHER PUBLICATIONS

Korean Notice of Office Action, with English translation, issued in Korean Patent Application No. 10-2008-0052137, dated May 17, 2010.

(Continued)

*Primary Examiner* — Jarrett Stark
*Assistant Examiner* — Michele Fan
(74) *Attorney, Agent, or Firm* — McDermott Will & Emery LLP (57) ABSTRACT

There is provided a method of growing a nitride single crystal. A method of growing a nitride single crystal according to an aspect of the invention may include: growing a first nitride single crystal layer on a substrate; forming a dielectric pattern having an open area on the first nitride single crystal layer, the open area exposing a part of an upper surface of the first nitride single crystal layer; and growing a second nitride single crystal layer on the first nitride single crystal layer through the open area while the second nitride single crystal layer grows to be equal to or larger than a height of the dielectric pattern, wherein the height of the dielectric pattern is greater than a width of the open area so that dislocations in the second nitride single crystal layer move laterally, collide with side walls of the dielectric pattern, and are terminated.

13 Claims, 8 Drawing Sheets

U.S. PATENT DOCUMENTS

2006/0270076 A1* 11/2006 Imer et al. .................. 438/22
2008/0020552 A1* 1/2008 Paek et al. ................. 438/478
2008/0142781 A1* 6/2008 Lee .............................. 257/13

FOREIGN PATENT DOCUMENTS

| JP | 2000-349338 A | | 12/2000 |
| --- | --- | --- | --- |
| JP | 2001-196700 A | | 7/2001 |
| JP | 2002-100575 A | | 4/2002 |
| JP | 2002100575 A | * | 4/2002 |
| JP | 2002-141282 A | | 5/2002 |
| KR | 10-2002-0071787 | | 9/2002 |
| KR | 10-2005-0069034 A | | 7/2005 |
| KR | 10-2006-0061568 A | | 6/2006 |

OTHER PUBLICATIONS

Korean Office Action, with English translation, issued in Korean Patent Application No. 10-2008-0052137, mailed Nov. 5, 2010.
Japanese Office Action, w/English translation thereof, issued in Japanese Patent Application No. 2008-287708, dated Sep. 20, 2011.

* cited by examiner

METHOD OF GROWING NITRIDE SINGLE CRYSTAL AND METHOD OF MANUFACTURING NITRIDE SEMICONDUCTOR LIGHT EMITTING DEVICE

CROSS-REFERENCE TO RELATED APPLICATIONS

This application claims the priority of Korean Patent Application No. 2008-0052137 filed on Jun. 3, 2008, in the Korean Intellectual Property Office, the disclosure of which is incorporated herein by reference.

BACKGROUND OF THE INVENTION

1. Field of the Invention

The present invention relates to a method of growing a nitride single crystal, and a method of manufacturing a nitride semiconductor light emitting device.

2. Description of the Related Art

In general, group III nitride semiconductors have received attention as materials used to manufacture visible light and ultraviolet ray LEDs configured as a light emitting diode (LED) or a laser diode (LD), and a blue-green optical device. In order to manufacture optical devices including these nitride semiconductors, a technique that grows high-quality single crystal thin films from group III nitride semiconductors is necessarily required. However, since substrates that match with lattice constants and thermal expansion coefficients of the group III nitride semiconductors are not commercially available, a method of growing a single crystal thin film is very limited.

According to the related art, examples of a method of growing a group III nitride semiconductor may include a method of growing a nitride semiconductor on a sapphire substrate ($Al_2O_3$) of a heterogeneous material by heteroepitaxy using Metal Organic Chemical Vapor Deposition (MOCVD) and Molecular Beam Epitaxy (MBE). However, a nitride single crystal is known to have a crystal defect of approximately $10^9$ to $10^{10}$ $cm^{-2}$ due to a difference in lattice constant and thermal expansion coefficient between the sapphire substrate and the nitride layer even when a low-temperature nucleation layer is used.

In order to lower crystal defects of the group III nitride semiconductors, lateral epitaxial overgrowth (LEO) is used. FIGS. 1A through 1D illustrate a method of growing a nitride semiconductor using LEO.

Figure 1A:
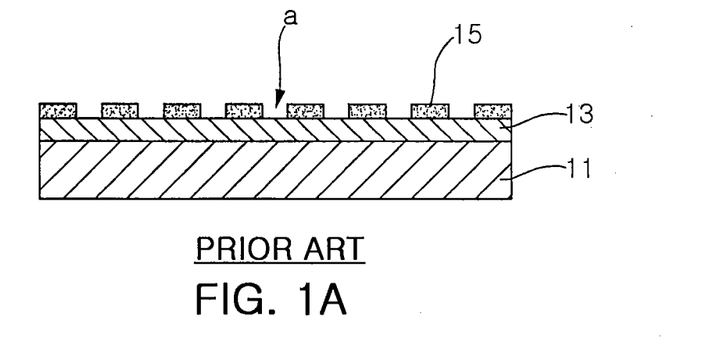
FIGS. 1A to 1D are cross-sectional views illustrating the process flow of a method of growing a nitride single crystal according to the related art.
Figure 1B:
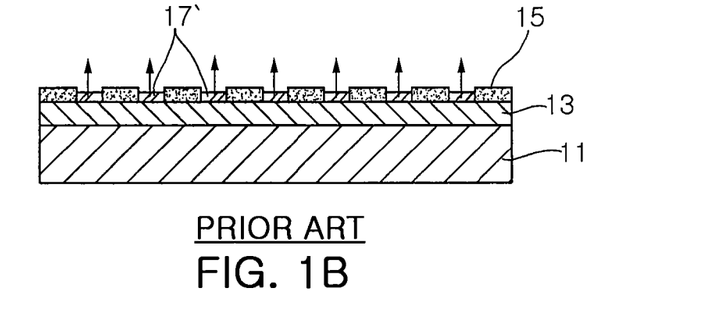

First, as shown in FIG. 1A, a low-temperature grown GaN buffer layer 13 is grown on a sapphire substrate 11, and then a dielectric mask 15 having a stripe pattern is formed thereon. The dielectric mask 15 is formed by depositing a dielectric material, such as $SiO_2$ or $SiN_x$, and patterning the deposited dielectric material to form stripe patterns at regular intervals by using a photolithography process.

Figure 1C:
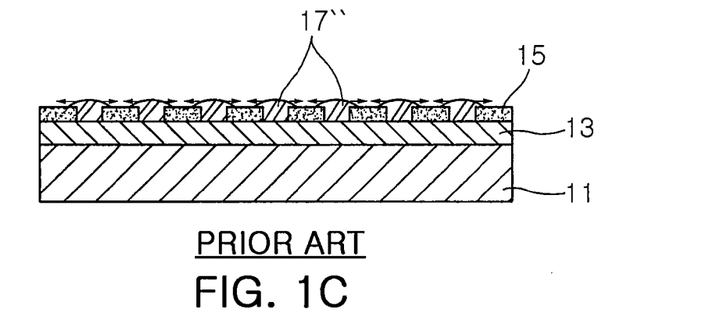
Figure 1D:
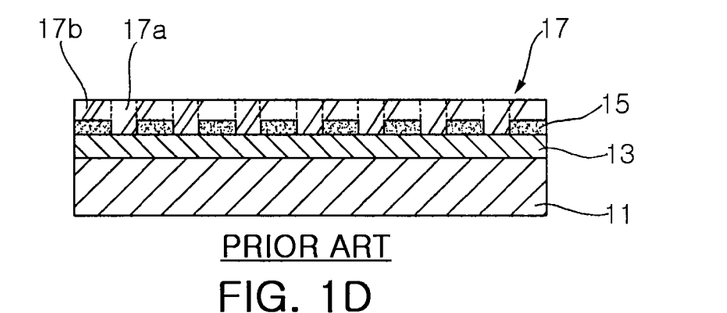

A nitride single crystal growth process is performed on the GaN buffer layer 13 having the dielectric mask 15 formed thereon by using the LEO. A nitride single crystal 17' is only grown in a window region a between the dielectric mask. If a height of the nitride single crystal 17' exceeds a height of the dielectric mask 15, the nitride single crystal grows laterally on the dielectric mask 15 as shown in FIG. 1C. As shown in FIG. 1D, the lateral growth leads to a growth of the nitride single crystal 17 over the dielectric mask 15.

Most of the dislocations in the buffer layer 13 are blocked by using a single crystal 17b that is grown along a horizontal direction, which is different from an initial direction in which dislocations propagate. Therefore, a nitride semiconductor layer having excellent crystallinity can be formed by using the LEO. For example, the potential density of the single crystal 17b on the dielectric mask 15 may be reduced to $10^6$ $cm^{-2}$. However, this region with a low dislocation density is limited to the upper region 17b of the dielectric mask 15. A region where the dielectric mask 15 is not formed has a relatively high dislocation density. When the LEO according to the related art is used, the dislocation density is not uniform despite the region with the low dislocation density. Therefore, there has been a need for the development of a method of growing a nitride single crystal having a uniform and large area with a low dislocation density.

SUMMARY OF THE INVENTION

An aspect of the present invention provides a method of growing a nitride single crystal having a uniform and large area with a low dislocation density.

An aspect of the present invention also provides a method of manufacturing a nitride semiconductor light emitting device having a nitride semiconductor layer with a low dislocation density to thereby increase light emitting efficiency.

According to an aspect of the present invention, there is provided a method of growing a nitride single crystal, the method including: growing a first nitride single crystal layer on a substrate; forming a dielectric pattern having an open area on the first nitride single crystal layer, the open area exposing a part of an upper surface of the first nitride single crystal layer; and growing a second nitride single crystal layer on the first nitride single crystal layer through the open area while the second nitride single crystal layer is grown to be equal to or larger than a height of the dielectric pattern, wherein the height of the dielectric pattern is greater than a width of the open area so that dislocations in the second nitride single crystal layer move laterally, collide with side walls of the dielectric pattern, and are terminated.

The height of the dielectric pattern may be at least twice as large as the width of the open area.

A ratio of the width of the open area to the height of the dielectric pattern may be 1:2 to 1:3.

The method may further include growing a third nitride single crystal layer on the second nitride single crystal layer after growing the second nitride single crystal layer.

In the growing the third nitride single crystal layer, the third nitride single crystal layer may be grown to be smaller than or equal to the height of the dielectric pattern.

The growing the third nitride single crystal layer may include growing the third nitride single crystal layer over the dielectric pattern until the third nitride single crystal layer covers the dielectric pattern.

The dielectric pattern may further include a lower pattern extending from the bottom of the side walls and covering the first nitride single crystal layer, and the lower pattern may narrow the exposed area of the first nitride single crystal layer.

The growing the second nitride single crystal layer may include: performing vertical growth preceding lateral growth of the second nitride single crystal; and performing lateral growth preceding vertical growth after performing the vertical growth so that dislocations in the second nitride single crystal collide with the side walls of the dielectric pattern, and are terminated.

The method may further include growing a third nitride single crystal layer on the second nitride single crystal later after performing the lateral growth.

The forming the dielectric pattern may be performed by dry etching.

The lower pattern may have a uniform height.

The forming the dielectric pattern may be performed by wet etching.

The lower pattern may have a curved surface, and opposite side walls of the lower pattern may become narrower from the top to the bottom.

The growing the second nitride crystal layer may be performed using Metal Organic Chemical Vapor Deposition (MOCVD).

According to another aspect of the present invention, there is provided a method of manufacturing a nitride semiconductor light emitting device, the method including: growing a first nitride single crystal layer on a substrate; forming a dielectric pattern having an open area on the first nitride single crystal layer, the open area exposing a part of an upper surface of the first nitride single crystal layer; growing a second nitride single crystal layer on the first nitride single crystal layer through the open area while the second nitride single crystal layer is grown to be smaller than or equal to a height of the dielectric pattern; and growing a first conductive nitride semiconductor layer, an active layer, and a second conductive nitride semiconductor layer on the second nitride single crystal layer to form a light emitting structure, wherein the height of the dielectric pattern is greater than a width of the open area, when the second nitride single crystal layer is grown, so that dislocations in the second nitride single crystal layer move laterally, collide with the dielectric pattern, and are terminated.

According to still another aspect of the present invention, there is provided a method of manufacturing a nitride semiconductor light emitting device, the method including: growing a first nitride single crystal layer on a substrate; forming a dielectric pattern having an open area on the first nitride single crystal layer, the open area exposing a part of an upper surface of the first nitride single crystal layer; growing a second nitride single crystal layer on the first nitride single crystal layer through the open area while the second nitride single crystal layer is grown to be smaller than or equal to a height of the dielectric pattern; growing a third nitride single crystal layer on the second nitride single crystal layer over the dielectric pattern until the third nitride single crystal layer covers the dielectric pattern; and growing a first conductive nitride semiconductor layer, an active layer, and a second conductive nitride semiconductor layer on the third nitride single crystal layer to form a light emitting structure, wherein the height of the dielectric pattern is greater than a width of the open area, when the second nitride single crystal layer is grown, so that dislocations in the second nitride single crystal layer move laterally, collide with side walls of the dielectric pattern, and are terminated.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may however be embodied in many different forms and should not be construed as limited to the embodiments set forth herein. Rather, these embodiments are provided so that this disclosure will be thorough and complete, and will fully convey the scope of the invention to those skilled in the art. Also, in the drawings, the same reference numerals are used throughout to designate the same components.

Figure 2A:
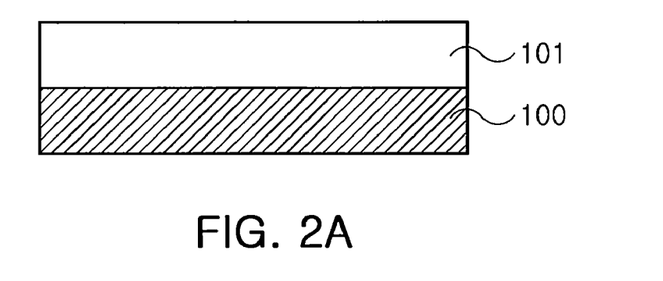
FIGS. 2A to 2E are cross-sectional views illustrating the process flow of a method of growing a nitride single crystal according to an exemplary embodiment of the invention.

FIGS. 2A to 2E are cross-sectional views illustrating the process flow of a method of growing a nitride single crystal according to an exemplary embodiment of the invention. First, as shown in FIG. 2A, a sapphire substrate 100 is provided, and a first nitride single crystal layer 101 is formed on the c-plane of the sapphire substrate 100. Here, in this embodiment, Metal Organic Chemical Vapor Deposition (MOCVD) is preferably used among known processes of forming the first nitride single crystal layer 101.

The sapphire substrate 100 is formed of a crystal having hexa-Rhombo R3c type symmetry, and has the c-plane (0001), the a-plane (1120), and the r-plane (1102). Further, the sapphire substrate 100 has a lattice constant of 13.001 Å along the c-axis and a lattice distance of 4.765 Å along the a-axis. Here, the c-plane of the sapphire substrate 100 is used as a nitride single crystal growth substrate since a nitride thin film is relatively easily grown at the c-plane, and is stable at high temperature. However, the present invention is not limited thereto. Various embodiments may include substrates formed of SiC, $MgAl_2O_4$, MgO, $LiAlO_2$, and $LiGaO_2$.

The first nitride single crystal layer 101 is used to regrow a nitride single crystal layer during a subsequent process after forming a dielectric pattern. The object and function thereof may be understood to be the similar with those of a basic procedure of lateral epitaxial overgrowth (LEO). Therefore, the first nitride single crystal layer 101 may be used as a low-temperature-grown GaN layer.

Figure 2B:
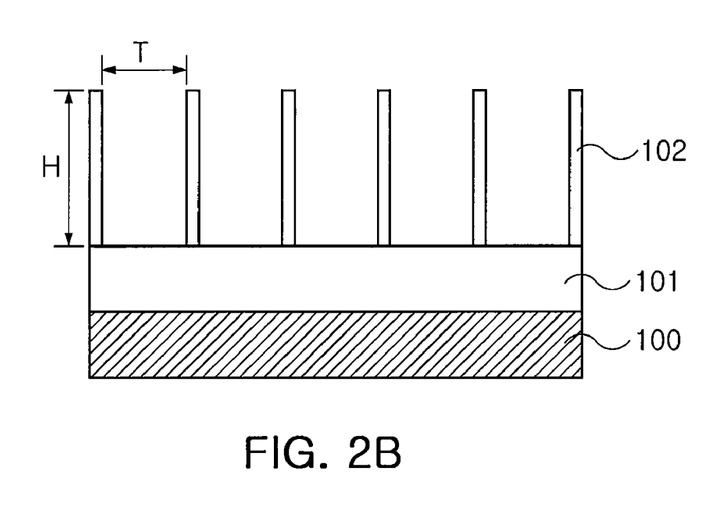

Then, as shown in FIG. 2B, a dielectric pattern 102 having an open area is formed on an upper surface of the first nitride single crystal layer 101. The dielectric pattern 102 is an insulating pattern formed of $SiO_2$ or $SiN_x$ by using a photolithography process known in the art. Specifically, the dielectric pattern 102 has a height H greater than a width T of the open area, such that dislocations can be eliminated by growing a nitride single crystal layer taller than the dielectric pattern 102, which will be described below. Specifically, the dielectric pattern 102 preferably has a height H twice greater than a width T of the open area. However, when the width T of the open area is, for example, 1 μm, it is very difficult to form the dielectric pattern 102 having a height of 3 μm or more. A ratio of the width T of the open area to the height H is 1:2 to 1:3.

Figure 2C:
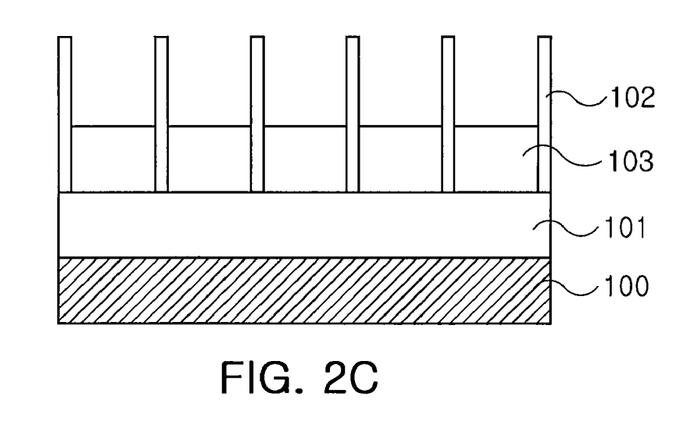

Next, as shown in FIG. 2C, a second nitride single crystal 103 is grown on the exposed upper surface of the first nitride single crystal layer 101 through the open area. The second nitride single crystal 103 is expressed by the following equation: $Al_xIn_yGa_{(1-x-y)}N$ (here, $0 \leq x \leq 1$, $0 \leq y \leq 1$, and $0 \leq x+y \leq 1$). Unlike the related art, in this embodiment, the second nitride single crystal 103 is grown smaller than the dielectric pattern 102. Specifically, the second nitride single crystal 103 is grown large enough so that the dislocations within the second nitride single crystal 103 propagate laterally, collide with side walls of the dielectric pattern 102, and are terminated. This will be described in more detail with reference to FIG. 3.

Figure 3:
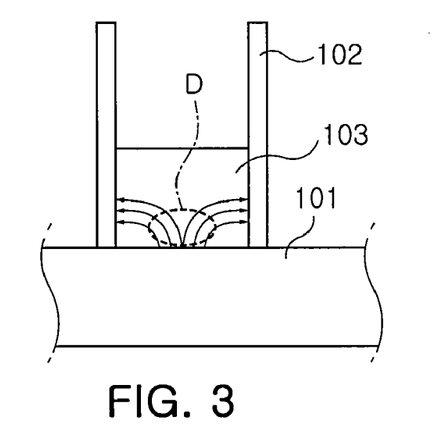
FIG. 3 is a view illustrating propagation of dislocations, shown in FIG. 2C.

FIG. 3 is a view illustrating the propagation of dislocations, shown in FIG. 2C. Referring to FIG. 3, a dislocation D in a central region of the second nitride single crystal 103 not only moves vertically but is also bent laterally. Here, by appropriately determining the height of the dielectric pattern 102 and the width of the open area, a considerable amount of the dislocation D that is bent and moves is blocked by the dielectric pattern 102, cannot move anymore, and finally disappears. To this end, as described above, the ratio of the width of the open area to the height of the dielectric pattern 102 is determined to 1:2 to 1:3. Even when the ratio satisfies 1:1 to 1:2, the dislocation can be reduced to a certain extent.

Figure 2D:
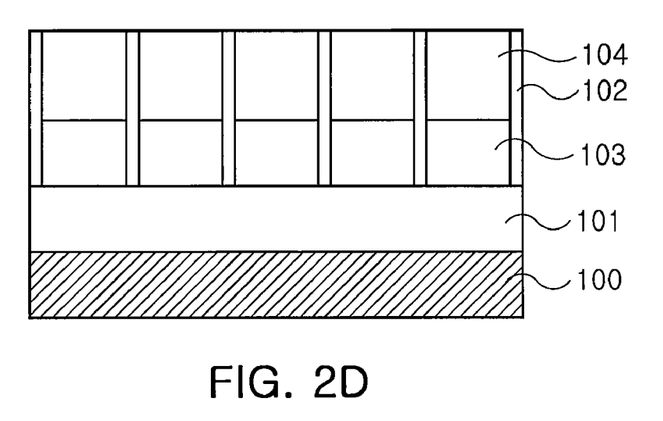
Figure 2E:
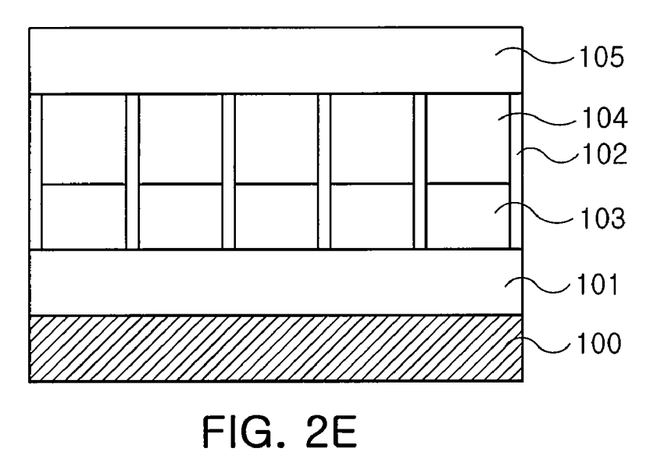

As such, the second nitride single crystal layer 103 that is grown according to this embodiment may have a region with a low defect density where most of the dislocations are terminated. As shown in FIG. 2D, a third nitride single crystal layer 104 is further grown to thereby obtain a high-quality single crystal. Here, since the dielectric pattern 102 has a relatively large height in this embodiment, even though a third nitride single crystal layer 104 is grown smaller than the dielectric pattern 102, a dislocation density of $10^6$ cm$^{-2}$, which is similar to the related art, can be obtained, and the dislocation density distribution is also uniform. The third nitride single crystal layer 104 forms a lamination structure of semiconductor layers doped with different materials, which can be used as a semiconductor light emitting device of the LED or the LD. As shown in FIG. 2E, the third nitride single crystal layer 104 may keep growing above the dielectric pattern 102, and be used as a large-area nitride single crystal substrate 105.

Figure 4A:
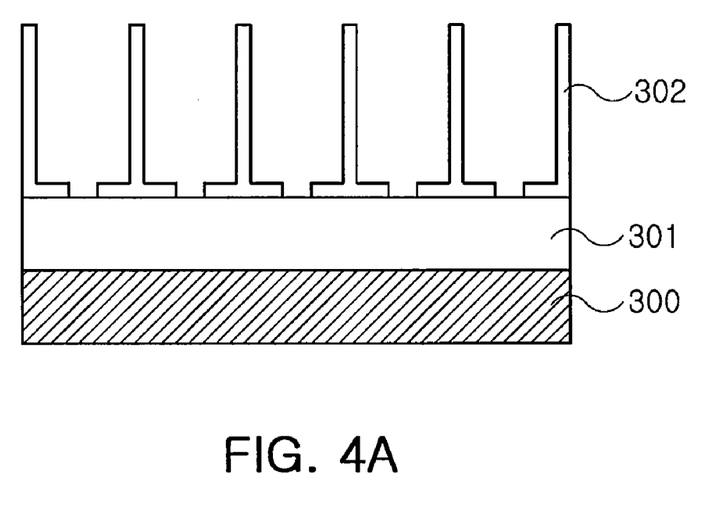
FIGS. 4A to 4D are cross-sectional views illustrating the process flow of a method of growing a nitride single crystal according to another exemplary embodiment of the invention.

FIGS. 4A to 4D are cross-sectional views illustrating the process flow of a method of growing a nitride single crystal according to another exemplary embodiment of the invention. Like the above-described embodiment, a first nitride single crystal layer 301 is grown on a sapphire substrate 300. Then, a dielectric pattern 302 is formed as shown in FIG. 4A. The dielectric pattern 302 is similar to that of the previous embodiment, and has a lower pattern extending from the lower part thereof to reduce an exposed area of an upper surface of the first nitride single crystal layer 301. Therefore, an area where a nitride single crystal is grown is limited to a central area that is separated from side walls of the dielectric pattern 302. The dielectric pattern 302 may be formed by dry etching, such as Inductively Coupled Plasma-Reactive Ion Etching (ICP-RIE), and the lower pattern has a uniform height.

Figure 4B:
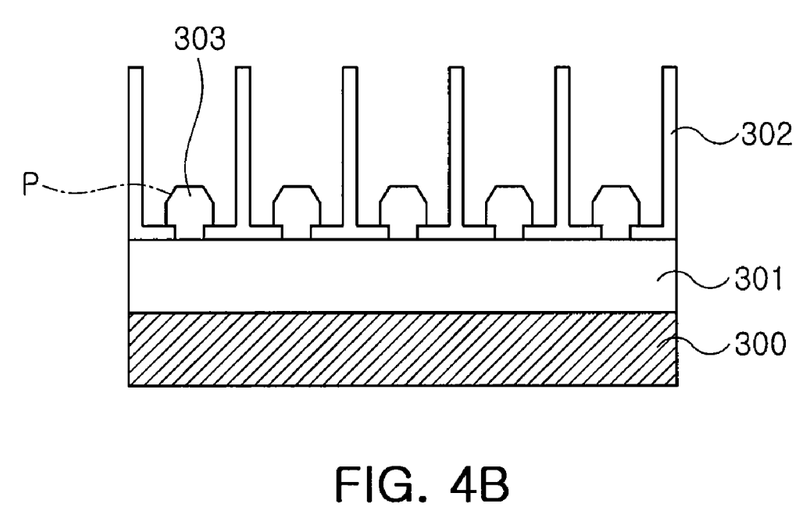

Then, as shown in FIG. 4B, the second nitride single crystal layer 303 is grown. Unlike the previous embodiment, here, vertical growth takes precedence over lateral growth. That is, a vertical growth process is performed so that a sufficient amount of dislocations can be transmitted in a lateral direction during a subsequent lateral growth process. Through the vertical growth process, the second nitride single crystal layer 303 has an outer surface of the c-plane and the p-plane (11-2x). Here, [−2] as in (11-2x) refers to [2] written with a bar. In the specification, Miller indices are written according to the same method. Here, (11-2x) denotes a (11-22) plane or a (11-23) plane. In order to make the lateral growth to predominate over the vertical growth, growth conditions, for example, temperature, pressure, a variation in ratio of the III/V group may be appropriately controlled.

Figure 4C:
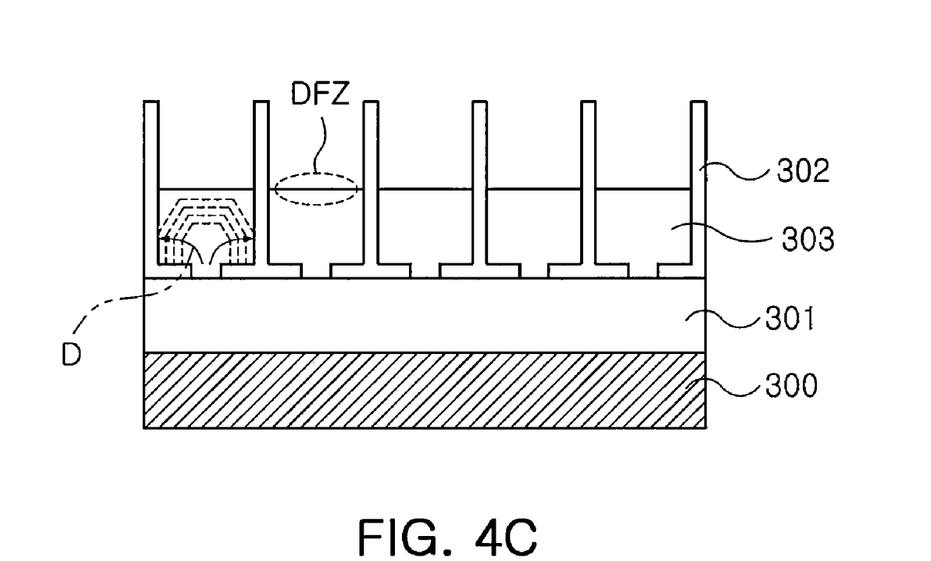
Figure 4D:
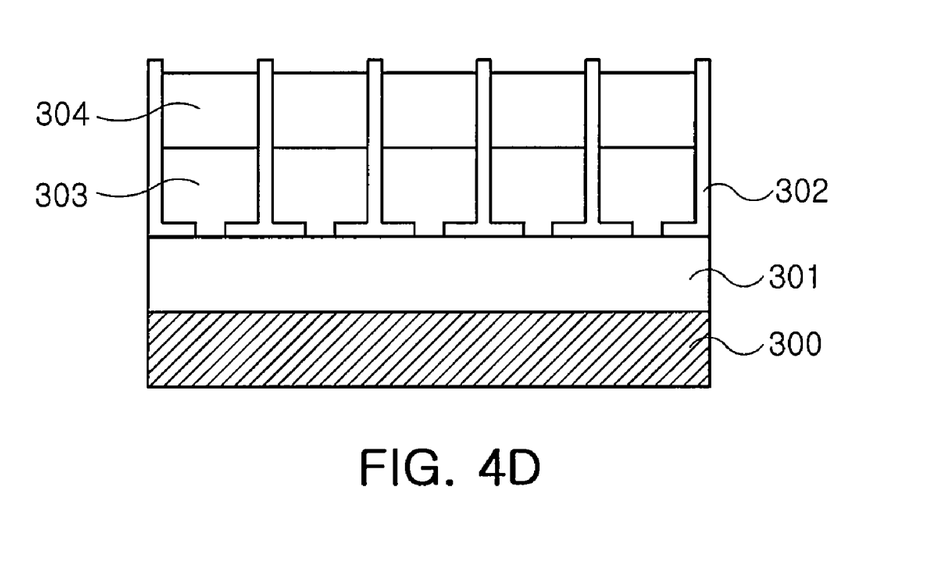

Next, as shown in FIG. 4C, while the growth of the second nitride single crystal layer 303 continues, the lateral growth predominates over the vertical growth, and the dislocation D moves laterally. In this embodiment, since the lateral growth follows the vertical growth, the dislocation D may move laterally and be terminated. Therefore, an upper area of the second nitride layer 303 becomes a dislocation free zone (DFZ). Then, as shown in FIG. 4D, the growth continues to thereby form a third nitride single crystal layer 304. The third nitride single crystal layer 304 has an area with low defect density where the dislocation density distribution is also uniform. The above-described vertical and lateral growth processes can be controlled by appropriately using processing conditions known to the art. For example, the lateral growth can be performed by increasing growth temperature and decreasing pressure.

FIGS. 5A to 5D are cross-sectional views illustrating the process flow of a method of growing a nitride single crystal according to still another exemplary embodiment of the invention. Like the previous embodiments, a first nitride single crystal layer 401 is grown on a sapphire substrate 400. Then, a dielectric pattern 402 is formed as shown in FIG. 4A. The dielectric pattern 402 is different from the dielectric pattern 302, shown in FIG. 3A, in that a lower pattern of the dielectric pattern 402 has a curved surface, and a distance between two opposite side walls of the dielectric pattern 402 becomes shorter toward the bottom. The dielectric pattern 402 may be formed by wet etching.

Figure 5A:
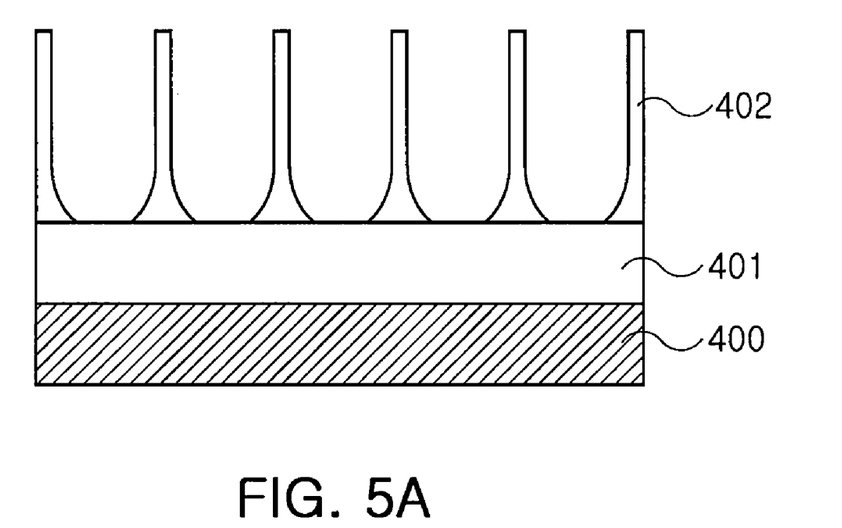
FIGS. 5A to 5D are cross-sectional views illustrating the process flow of a method of growing a nitride single crystal according to still another exemplary embodiment of the invention.
Figure 5B:
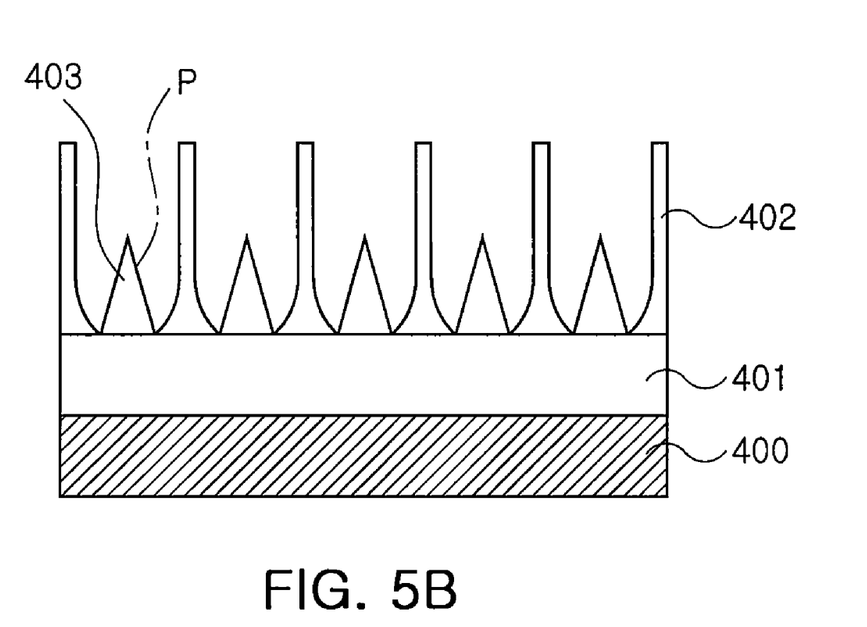

Then, as shown in FIG. 5B, a second nitride single crystal layer 403 is grown. Like the previous embodiments, a vertical growth process precedes a lateral growth process. Therefore, the crystal layer 403 has an outer surface of the p-plane (11-2x).

Figure 5C:
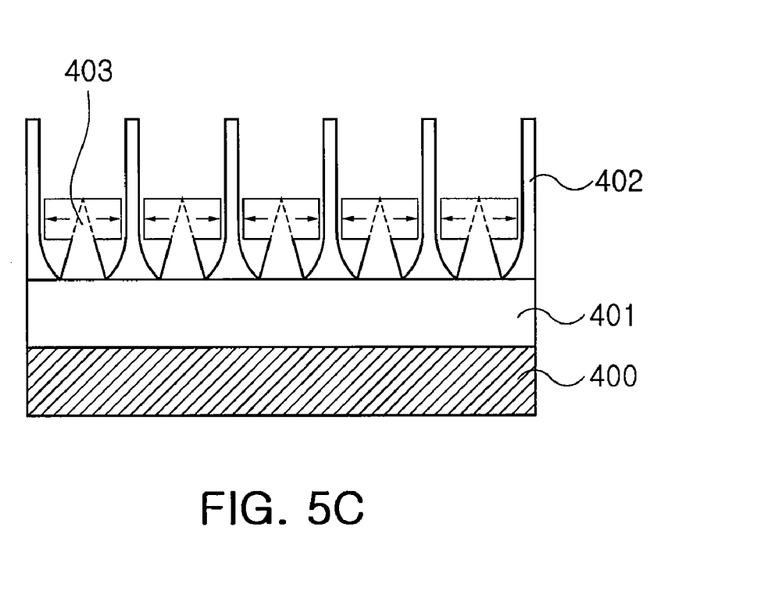
Figure 5D:
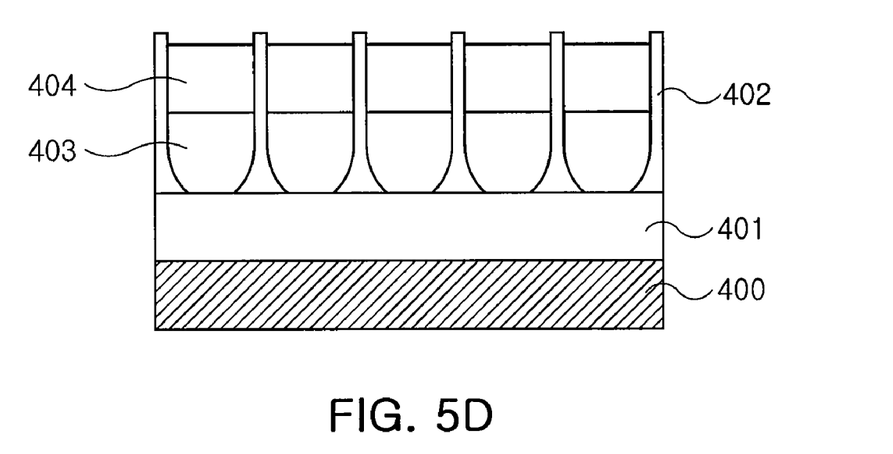

Next, as shown in FIG. 5C, while the second nitride single crystal layer 403 continues to grow, the lateral growth precedes the vertical growth, and a dislocation D moves laterally. After that, like the embodiment, shown in FIG. 4, the growth continues to thereby obtain a third nitride single crystal layer 404 as shown in FIG. 5D. The third nitride single crystal layer 404 has an area with a uniform dislocation density and a low defect density.

Figure 6:
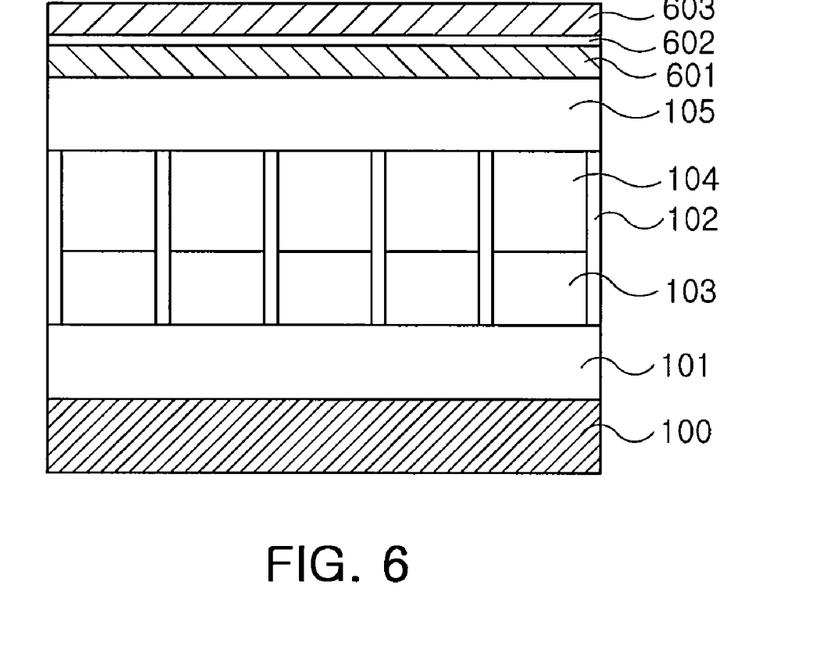
FIG. 6 is a cross-sectional view illustrating a nitride semiconductor light emitting device according to an exemplary embodiment of the invention.
Figure 7:
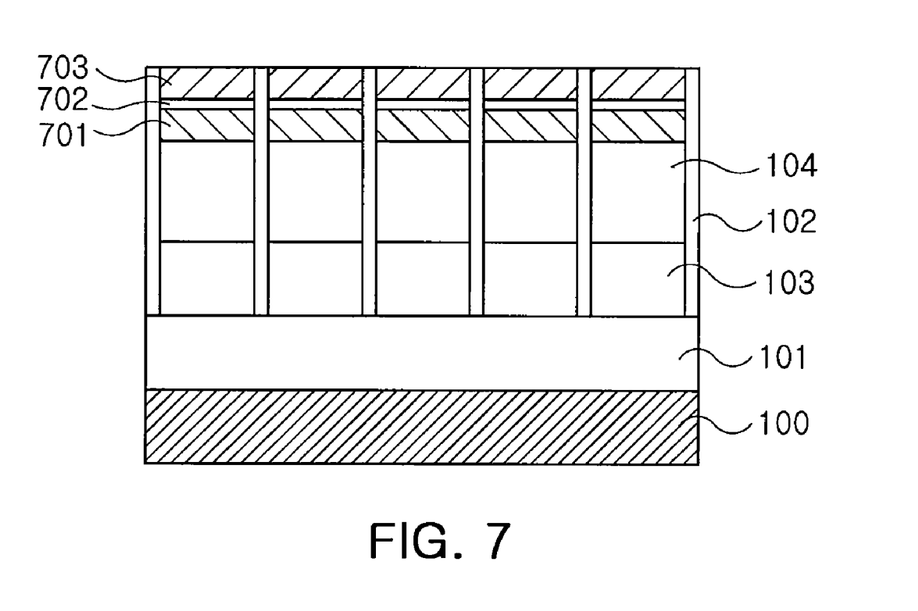
FIG. 7 is a cross-sectional view illustrating a nitride semiconductor light emitting device according to another exemplary embodiment of the invention.

A nitride semiconductor light emitting device can be manufactured by forming a light emitting structure on the nitride single crystal substrate on the basis of the above-described method of manufacturing a nitride single crystal substrate. FIG. 6 is a cross-sectional view illustrating a nitride semiconductor light emitting device according to an exemplary embodiment of the invention. FIG. 7 is a cross-sectional view illustrating a nitride semiconductor light emitting device according to another exemplary embodiment of the invention.

First, referring to FIG. 6, a nitride single crystal substrate 105 is manufactured according to the method described with reference to FIG. 2, and then an n-type nitride semiconductor layer 601, an active layer 602, and a p-type nitride semiconductor layer 603 are grown on the nitride single crystal substrate 105 by MOCVD, such that a nitride semiconductor light emitting device can be obtained. Here, electrodes are provided on a structure, shown in FIG. 6, so as to be used as a light emitting device. Alternatively, the n-type nitride semiconductor layer 601 and the nitride single crystal substrate 105 may be appropriately separated from each other by using a mechanical or chemical method. Here, the description of a case in which the n-type nitride semiconductor layer 601 is first grown on the nitride single crystal substrate 105 has been made. However, a p-type nitride semiconductor layer may be first grown according to an embodiment. A nitride semiconductor light emitting device may be formed on the nitride single crystal substrate manufactured by using the method described in FIGS. 4 and 5, but not the method described in FIG. 2.

Next, referring to FIG. 7, while the method according to this embodiment is similar to the method described in FIG. 2, a light emitting structure is formed on the third nitride single crystal layer 104, and does not have a height greater than that of the dielectric pattern 102. Here, like the embodiment, shown in FIG. 6, the light emitting structure includes an n-type nitride semiconductor layer 701, an active layer 702, and a p-type nitride semiconductor layer 703. The light emitting structure may further include an electrode structure (not shown).

The nitride semiconductor light emitting device, manufactured according to the method of FIG. 6 or 7, is formed on the nitride single crystal layer (also referred to as a nitride single crystal substrate) having a relatively low defect density. Therefore, the nitride semiconductor layer included therein also has high quality. Therefore, the light emitting efficiency can be expected to be improved.

As set forth above, according to exemplary embodiments of the invention, a method of growing a nitride single crystal having a uniform dislocation density and a low defect density can be obtained. Further, a method of manufacturing a nitride semiconductor light emitting device that has a nitride semiconductor layer having an area with low dislocation density to thereby increase light emitting efficiency can be obtained.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of growing a nitride single crystal, the method comprising:
   growing a first nitride single crystal layer on a substrate;
   forming a dielectric pattern having an open area on the first nitride single crystal layer, the open area exposing a part of an upper surface of the first nitride single crystal layer; and
   growing a second nitride single crystal layer on the first nitride single crystal layer through the open area while the second nitride single crystal layer is grown to be smaller than or equal to a height of the dielectric pattern,
   wherein the height of the dielectric pattern is greater than a width of the open area so that dislocations in the second nitride single crystal layer move laterally, collide with side walls of the dielectric pattern, and are terminated,
   wherein the growing the second nitride single crystal layer comprises:
   performing vertical growth preceding lateral growth of the second nitride single crystal; and
   performing lateral growth preceding vertical growth after performing the vertical growth so that dislocations in the second nitride single crystal collide with the side walls of the dielectric pattern, and are terminated.

2. The method of claim 1, further comprising growing a third nitride single crystal layer on the second nitride single crystal layer after growing the second nitride single crystal layer.

3. The method of claim 2, wherein in the growing the third nitride single crystal layer, the third nitride single crystal layer is grown to be smaller than or equal to the height of the dielectric pattern.

4. The method of claim 2, wherein the growing the third nitride single crystal layer comprises growing the third nitride single crystal layer over the dielectric pattern until the third nitride single crystal layer covers the dielectric pattern.

5. The method of claim 1, wherein the dielectric pattern further comprises a lower pattern extending from the bottom of the side walls and covering the first nitride single crystal layer, and the lower pattern narrows the exposed area of the first nitride single crystal layer.

6. The method of claim 5, further comprising growing a third nitride single crystal layer on the second nitride single crystal later after performing the lateral growth.

7. The method of claim 5, wherein the forming the dielectric pattern is performed by dry etching.

8. The method of claim 7, wherein the lower pattern has a uniform height.

9. The method of claim 5, wherein the forming the dielectric pattern is performed by wet etching.

10. The method of claim 9, wherein the lower pattern has a curved surface, and opposite side walls of the lower pattern become narrower from the top to the bottom.

11. The method of claim 1, wherein the growing the second nitride layer is performed using Metal Organic Chemical Vapor Deposition (MOCVD).

12. A method of manufacturing a nitride semiconductor light emitting device, the method comprising:
   growing a first nitride single crystal layer on a substrate;
   forming a dielectric pattern having an open area on the first nitride single crystal layer, the open area exposing a part of an upper surface of the first nitride single crystal layer;
   growing a second nitride single crystal layer on the first nitride single crystal layer through the open area while the second nitride single crystal layer is grown to be smaller than or equal to a height of the dielectric pattern; and
   growing a first conductive nitride semiconductor layer, an active layer, and a second conductive nitride semiconductor layer on the second nitride single crystal layer to form a light emitting structure,
   wherein the height of the dielectric pattern is greater than a width of the open area, when the second nitride single crystal layer is grown, so that dislocations in the second nitride single crystal layer move laterally, collide with the dielectric pattern, and are terminated,
   wherein the growing the second nitride single crystal layer comprises:
   performing vertical growth preceding lateral growth of the second nitride single crystal; and
   performing lateral growth preceding vertical growth after performing the vertical growth so that dislocations in the second nitride single crystal collide with the side walls of the dielectric pattern, and are terminated.

13. A method of manufacturing a nitride semiconductor light emitting device, the method comprising:
   growing a first nitride single crystal layer on a substrate;
   forming a dielectric pattern having an open area on the first nitride single crystal layer, the open area exposing a part of an upper surface of the first nitride single crystal layer;

growing a second nitride single crystal layer on the first nitride single crystal layer through the open area while the second nitride single crystal layer is grown to be smaller than or equal to a height of the dielectric pattern;

growing a third nitride single crystal layer on the second nitride single crystal layer over the dielectric pattern until the third nitride single crystal layer covers the dielectric pattern; and growing a first conductive nitride semiconductor layer, an active layer, and a second conductive nitride semiconductor layer on the third nitride single crystal layer to form a light emitting structure, wherein the height of the dielectric pattern is greater than a width of the open area, when the second nitride single crystal layer is grown, so that dislocations in the second nitride single crystal layer move laterally, collide with side walls of the dielectric pattern, and are terminated, wherein the growing the second nitride single crystal layer comprises:

performing vertical growth preceding lateral growth of the second nitride single crystal; and performing lateral growth preceding vertical growth after performing the vertical growth so that dislocations in the second nitride single crystal collide with the side walls of the dielectric pattern, and are terminated.

* * * * *